(12) United States Patent
Satpathy et al.

(10) Patent No.: US 9,825,649 B1
(45) Date of Patent: Nov. 21, 2017

(54) EFFICIENT HUFFMAN DECODER IMPROVEMENTS

(71) Applicant: INTEL CORPORATION, Santa Clara, CA (US)

(72) Inventors: Sudhir K. Satpathy, Hillsboro, OR (US); Sanu K. Mathew, Hillsboro, OR (US); Vikram B. Suresh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/280,827

(22) Filed: Sep. 29, 2016

(51) Int. Cl.
  *H03M 7/40* (2006.01)
  *H03M 7/30* (2006.01)
(52) U.S. Cl.
  CPC ........ *H03M 7/4006* (2013.01); *H03M 7/3086* (2013.01); *H03M 7/40* (2013.01)
(58) Field of Classification Search
  CPC ..... H03M 7/4006; H03M 7/40; H03M 7/3086
  USPC .......................................................... 341/65
  See application file for complete search history.

(56) References Cited

U.S. PATENT DOCUMENTS

| | | | | |
|---|---|---|---|---|
| 5,675,332 A | * | 10/1997 | Limberg | H03M 7/425 341/65 |
| 5,798,719 A | * | 8/1998 | Wise | G06F 12/0207 341/65 |
| 6,043,765 A | * | 3/2000 | Twardowski | H03M 7/4081 341/65 |
| 7,380,099 B2 | | 5/2008 | Mathew et al. | |
| 7,860,240 B2 | | 12/2010 | Mathew et al. | |
| 8,855,302 B2 | | 10/2014 | Sheikh et al. | |
| 8,923,510 B2 | | 12/2014 | Gueron et al. | |
| 9,225,521 B2 | | 12/2015 | Sheikh et al. | |
| 9,252,805 B1 | * | 2/2016 | Abali | H03M 7/40 |
| 9,306,596 B2 | | 4/2016 | Satpathy et al. | |
| 2016/0219295 A1 | | 7/2016 | Satpathy et al. | |

FOREIGN PATENT DOCUMENTS

WO    2006/039610 A1    4/2006

* cited by examiner

*Primary Examiner* — Brian Young
(74) *Attorney, Agent, or Firm* — Compass IP Law PC

(57) ABSTRACT

An apparatus including a Huffman decoder circuit is described. In a first embodiment, the Huffman decoder circuit includes a register file with simultaneous parallel load capability. The register file is to keep multiple copies of same decoded values in different entries of the register file. The different entries are to be addressed by respective addresses having a same leading edge encoded symbol. The parallel load capability is to simultaneously load a same decoded value for those register file addresses having a same leading edge encoded symbol. In a second embodiment, the Huffman decoder circuit includes a CAM circuit coupled to a register file, wherein respective match lines of the CAM circuit are coupled to respective entries of the register file. The CAM circuit is to keep encoded symbols. The register file is to keep decoded values of the encoded symbols.

20 Claims, 10 Drawing Sheets

| Header 302 | Compressed Payload 303 |
|---|---|

Packet of Compressed Information 301

EFFICIENT HUFFMAN DECODER IMPROVEMENTS

FIELD OF INVENTION

The field of invention pertains generally to the computing sciences, and, more specifically, to efficient Huffman decoder improvements.

BACKGROUND

Computing systems typically include non volatile mass storage to store sectors or blocks of data and program code. A pertinent issue in many computer systems is the performance of intercommunications within the computing system. Finding ways to improve efficiency of communications within a computing system is therefore a motivation of computing system engineers.

FIGURES

Figure 1:
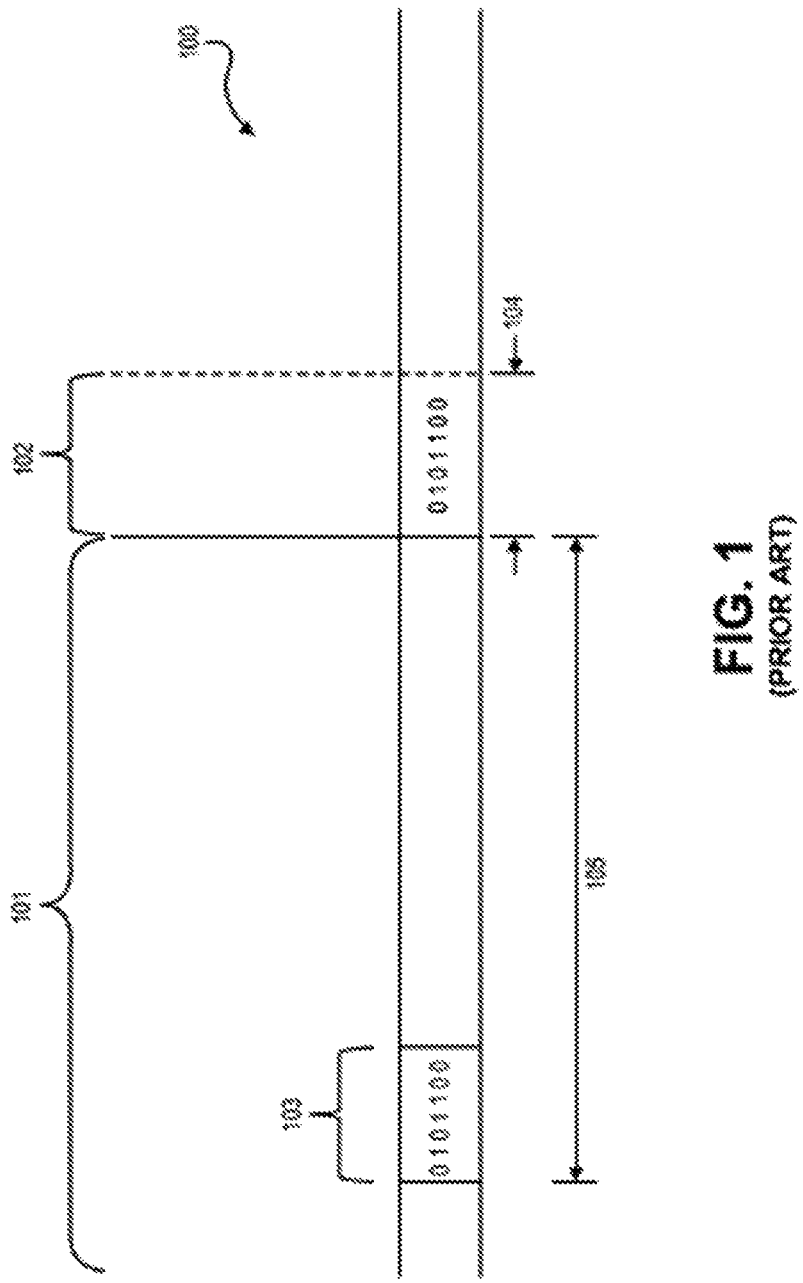
Figure 2:
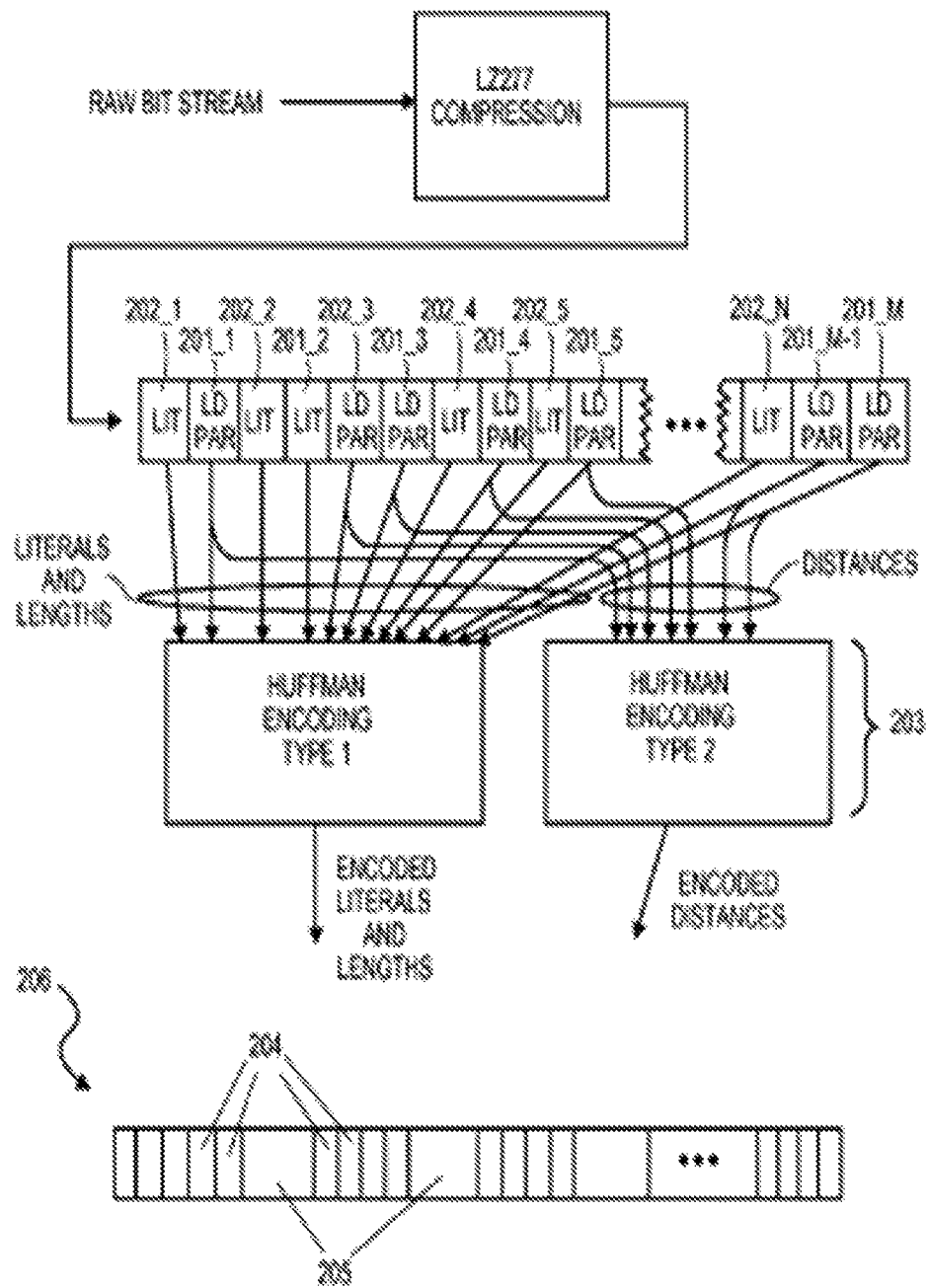
Figure 3:
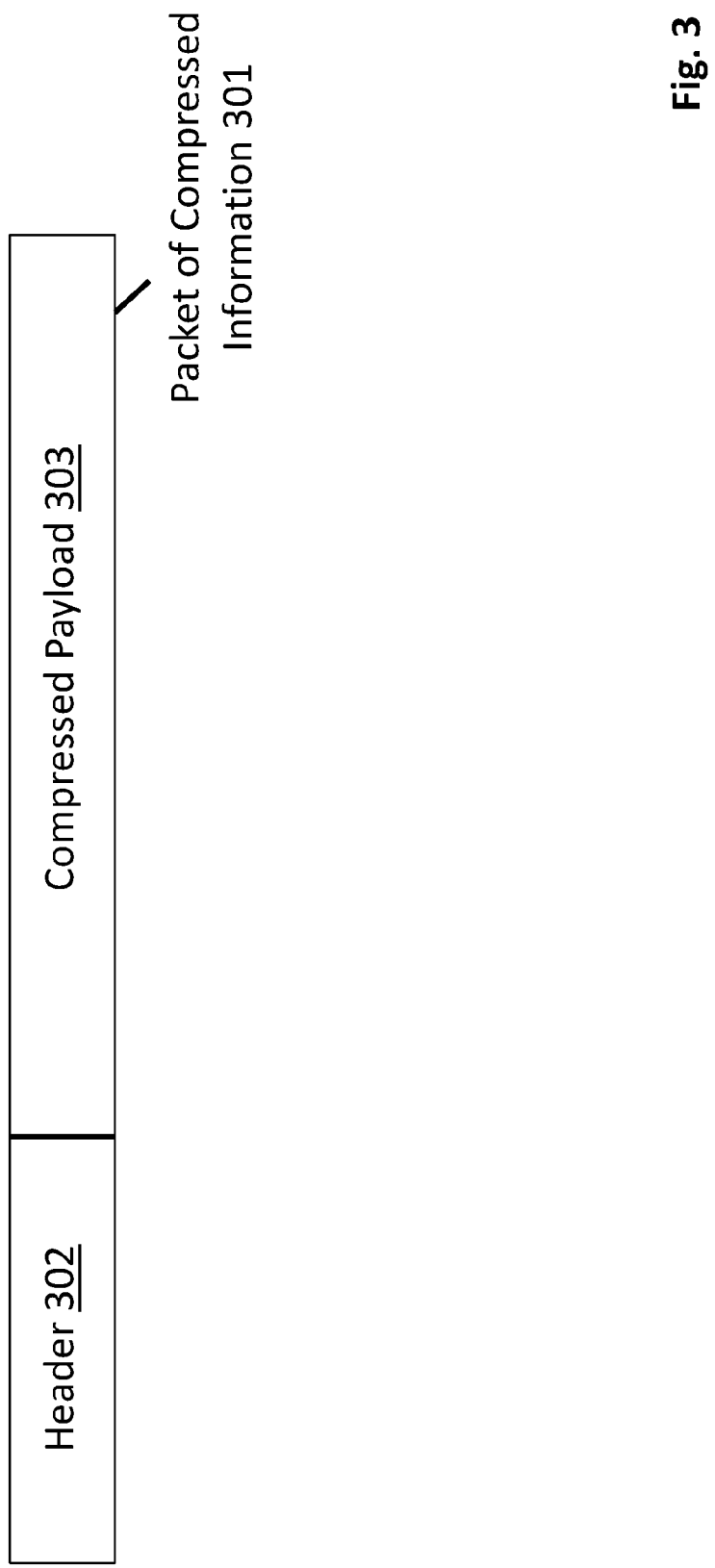
Figure 4:
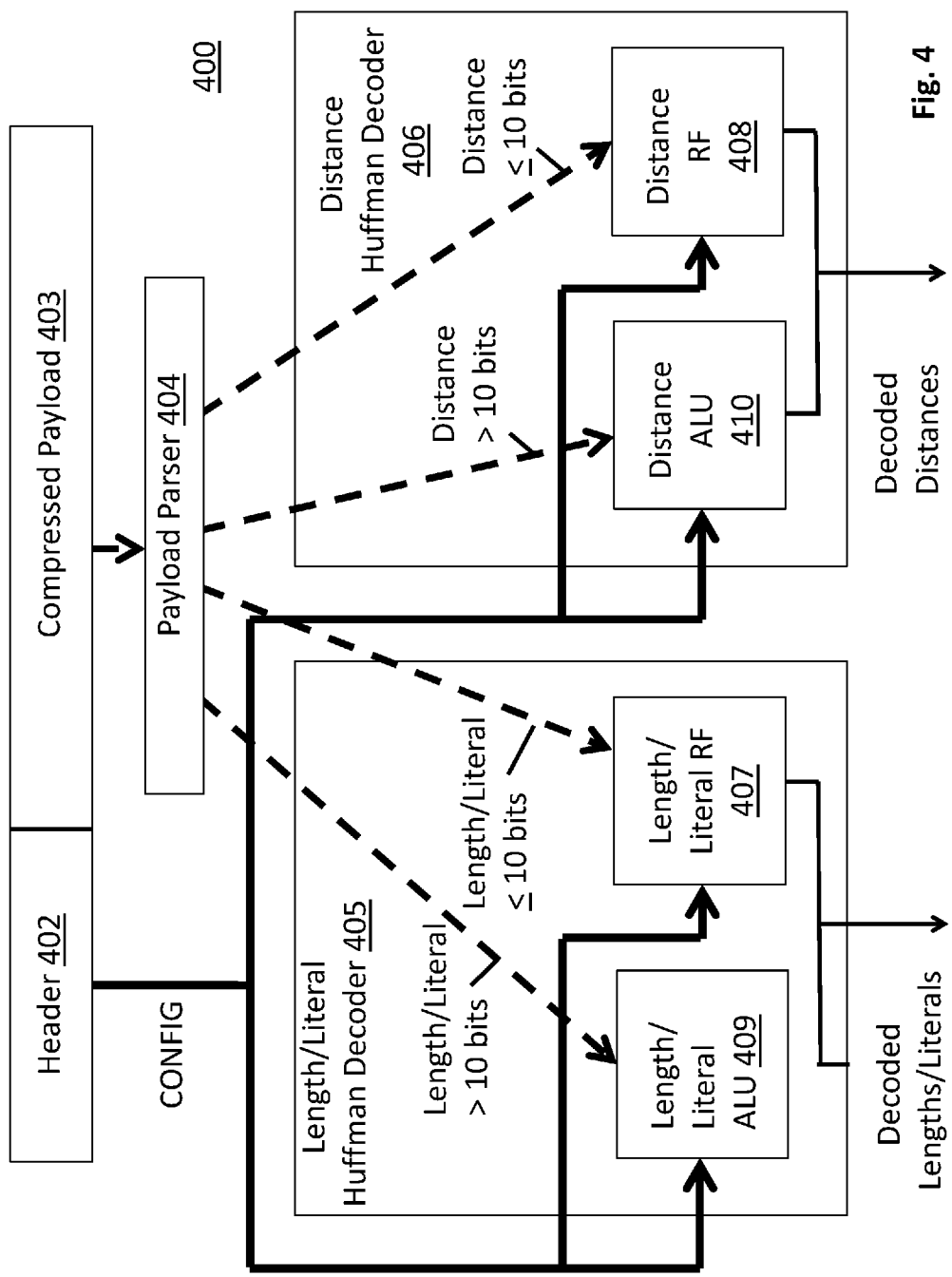
Figure 5A:
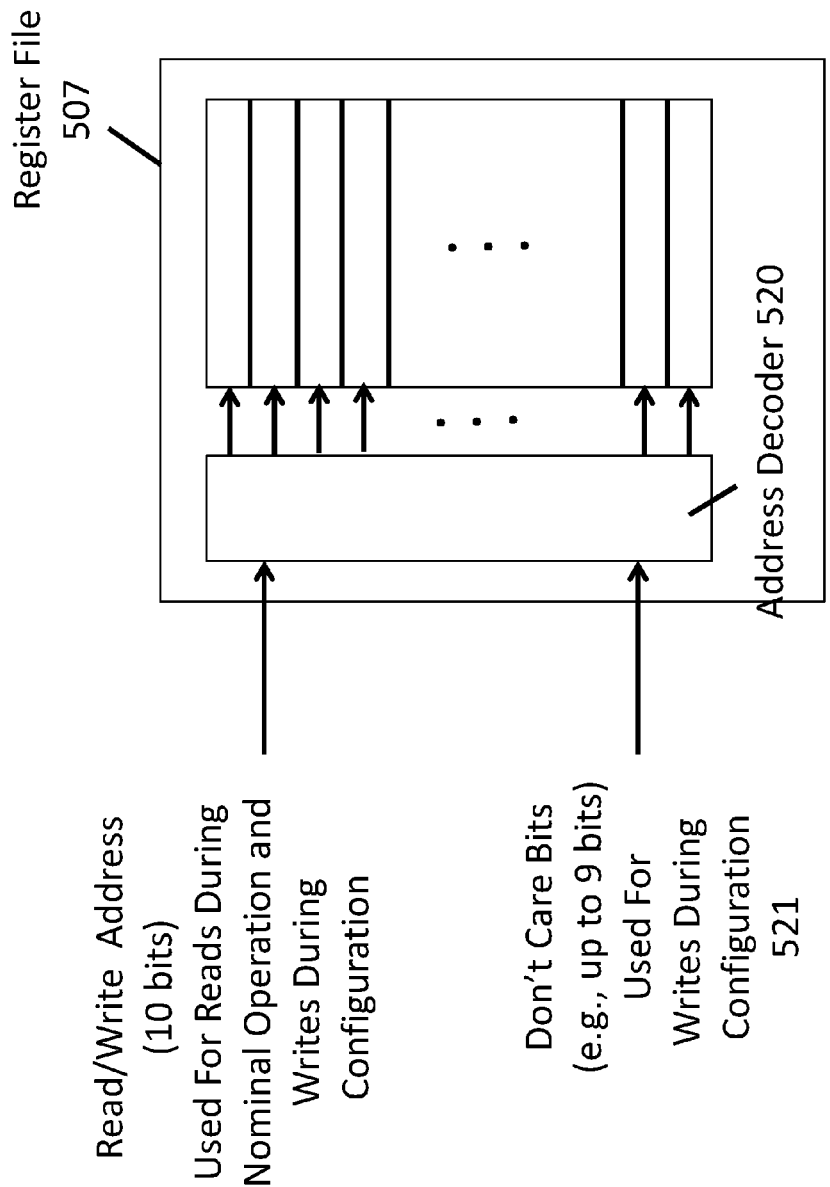
Figure 5B:
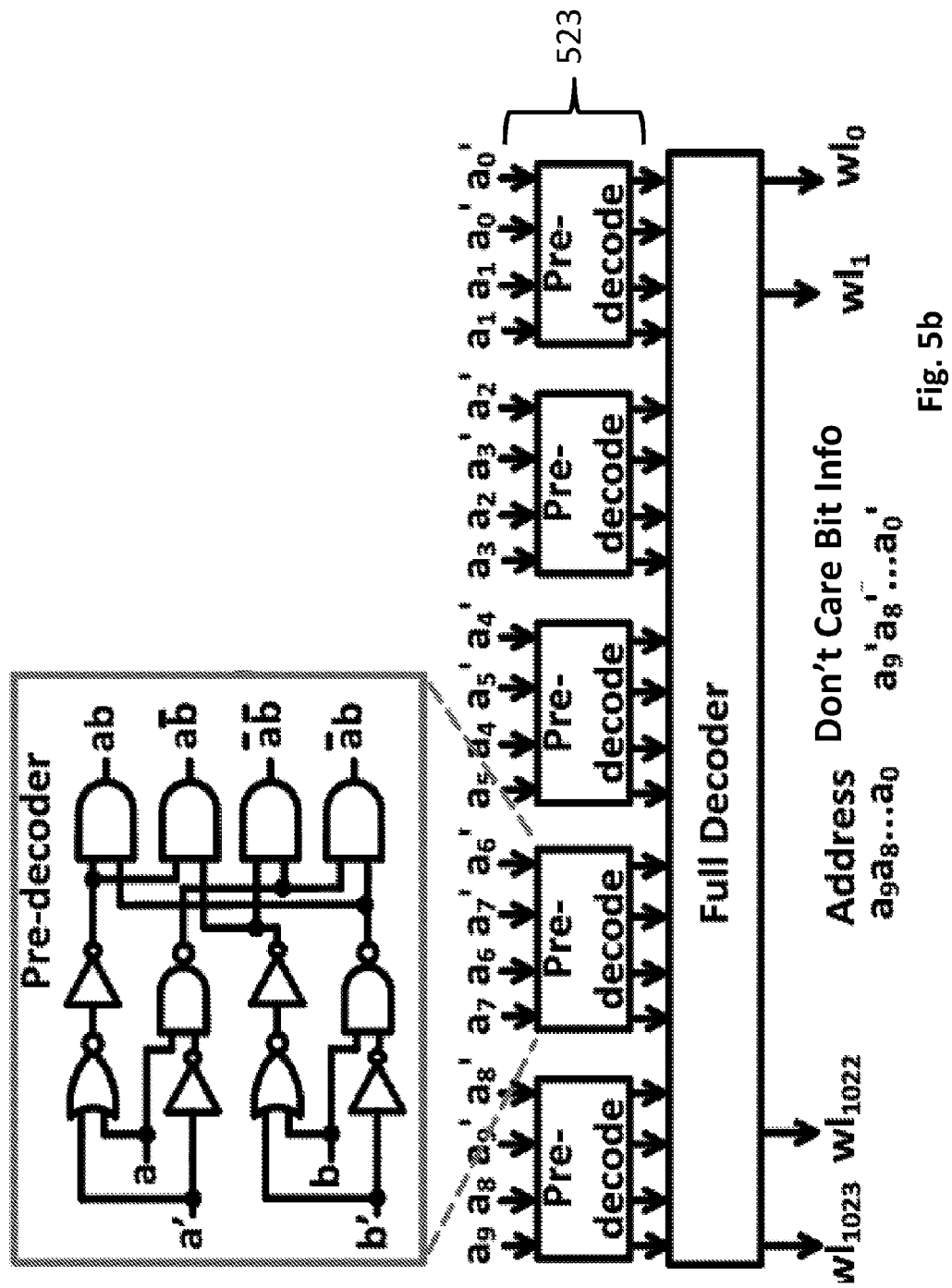
Figure 6:
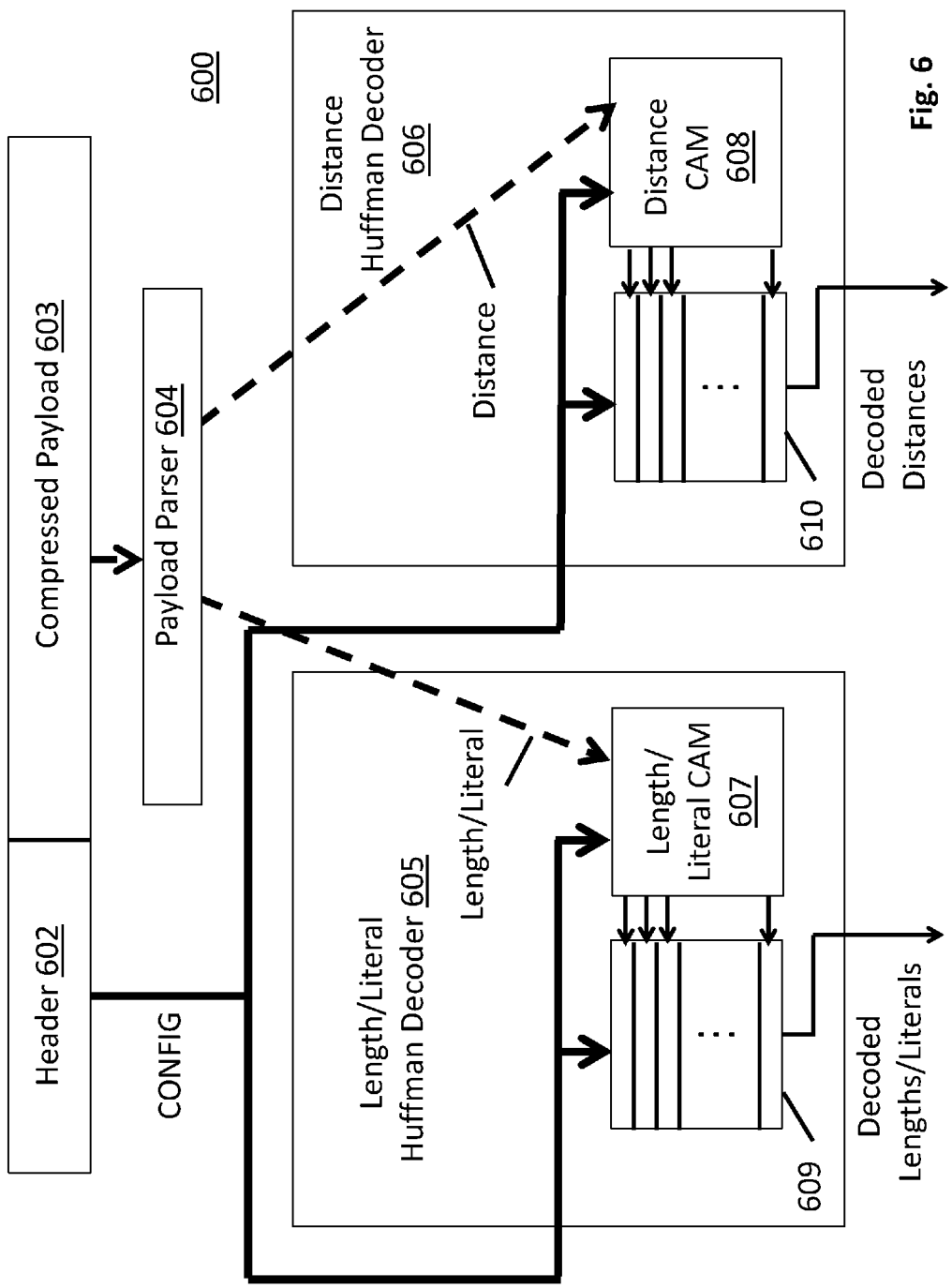
Figure 7:
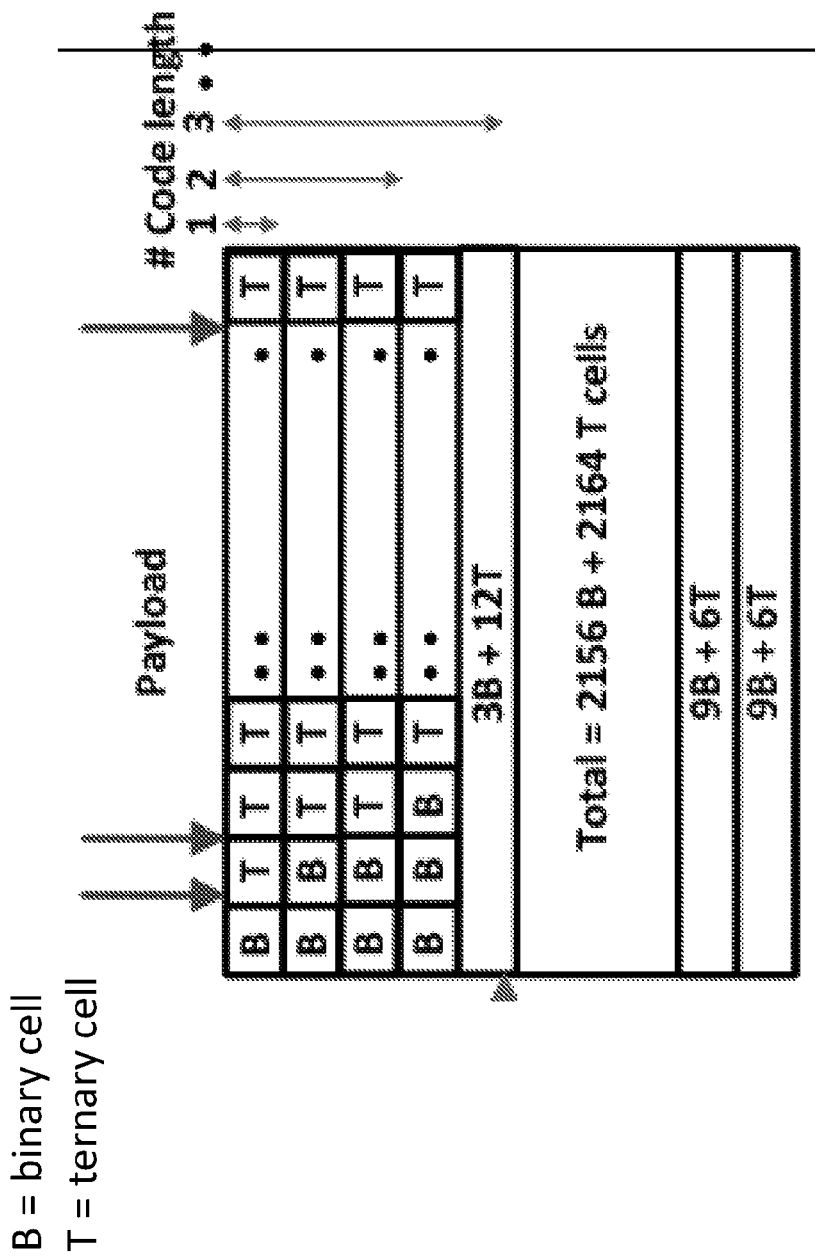
Figure 8:
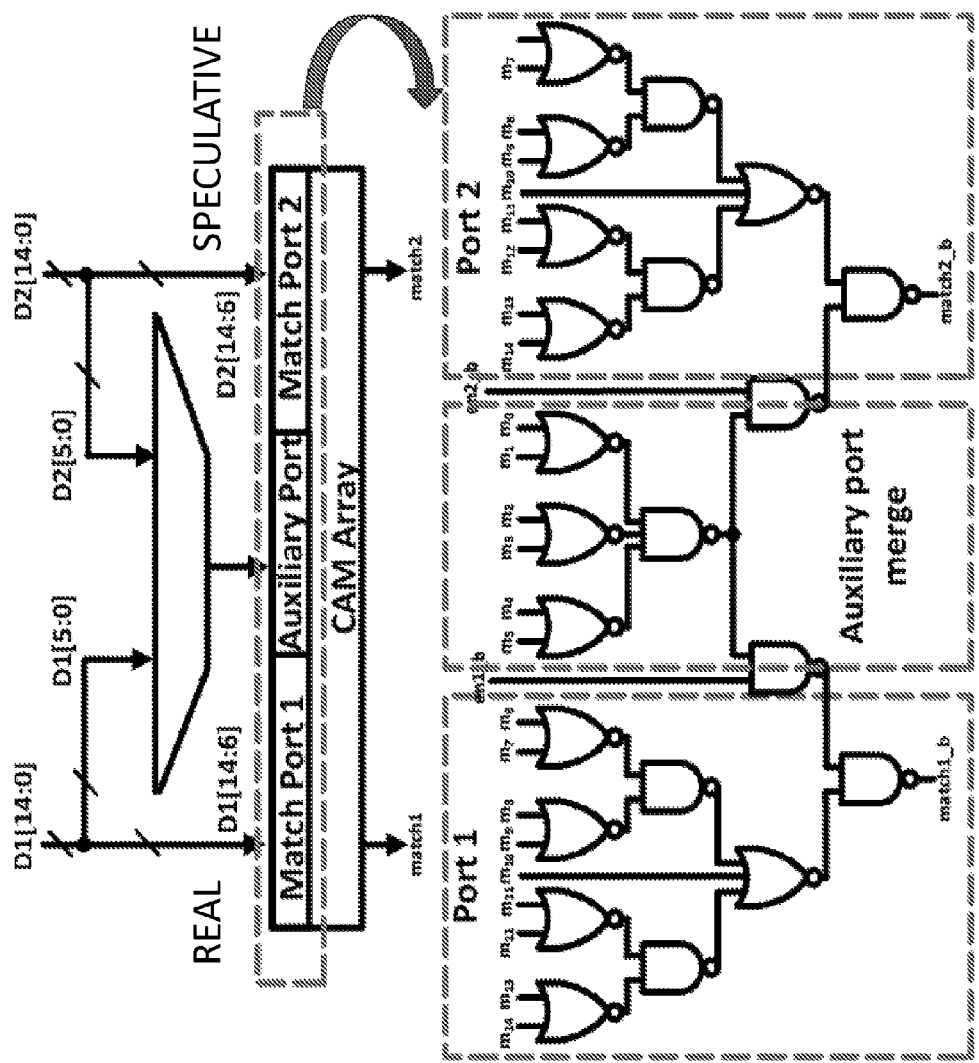
Figure 9:
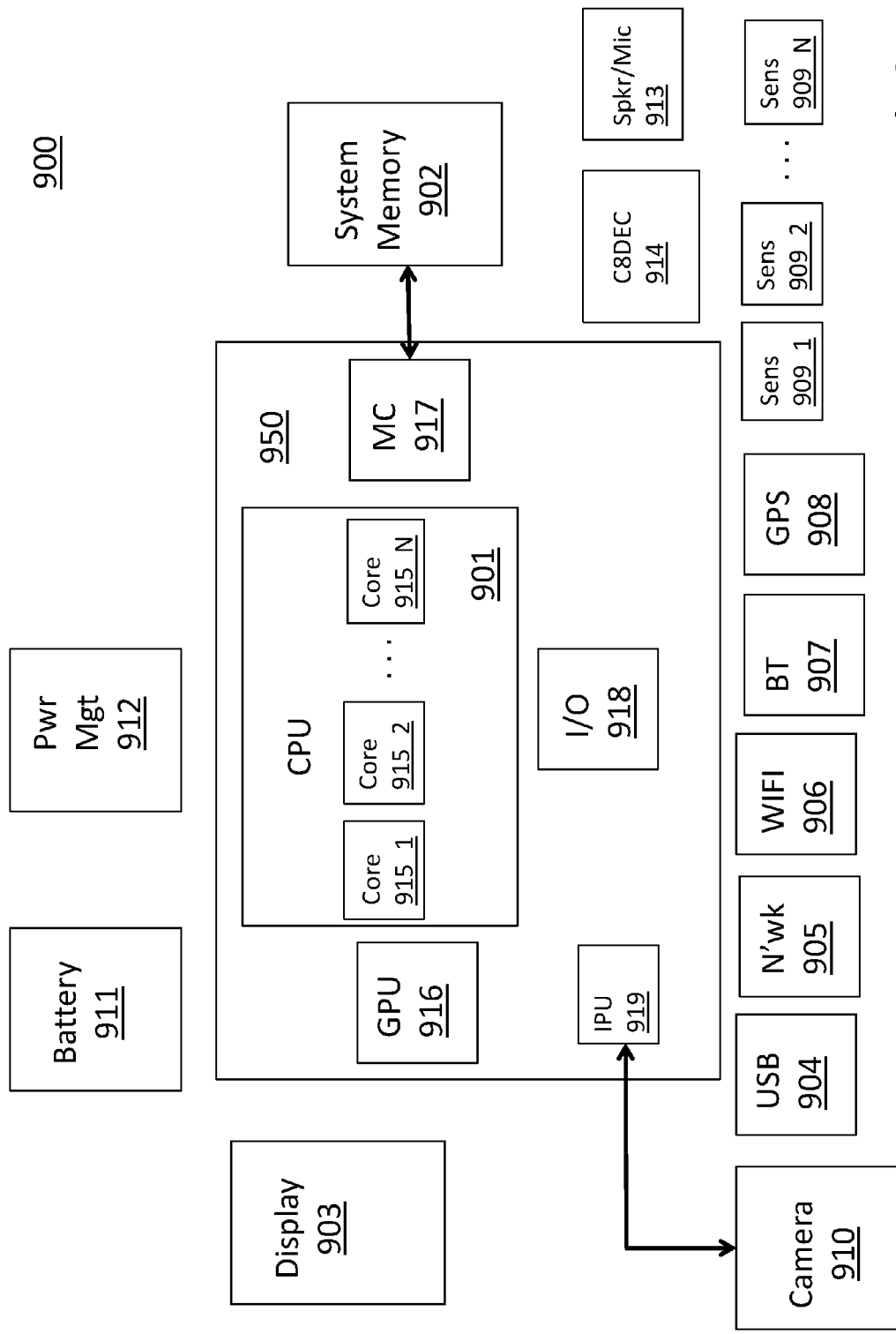

A better understanding of the present invention can be obtained from the following detailed description in conjunction with the following drawings, in which:

FIG. 1 shows a LZ77 compression algorithm;
FIG. 2 shows a DEFLATE compression algorithm;
FIG. 3 shows a packet comprising a header and compressed payload;
FIG. 4 shows a first embodiment of a Huffman decoder circuit;
FIG. 5a shows a register file;
FIG. 5b shows a more detailed view of the register file;
FIG. 6 shows a second embodiment of a Huffman decoder circuit;
FIG. 7 shows CAM circuit;
FIG. 8 shows another view of a CAM circuit;
FIG. 9 shows a computing system.

DETAILED DESCRIPTION

LZ77 Compression Algorithm

Compression algorithms strive to reduce an amount of data without sacrificing the information within the data. One type of compression algorithm, referred to as the LZ77 algorithm, achieves compression by replacing repeated occurrences of data with references to a single copy of that data existing earlier in the input (uncompressed) data stream. A match is encoded by a pair of numbers called a length-distance pair (the "distance" is sometimes called the "offset" instead).

To spot matches, the encoder keeps track of some amount of the most recent data, such as the last 2 kB, 4 kB, or 32 kB. The structure in which this data is held is called a "sliding window" (as such, LZ77 is sometimes called sliding window compression). The encoder keeps the most recent data within the sliding window to look for matches (and the decoder likewise will keep this data to interpret the matches the encoder refers to).

FIG. 1 shows a simple example of an LZ77 encoding scheme. As observed in FIG. 1, the bit patterns of a preceding (earlier or older) portion 101 of a bit stream 100 is compared against a current portion 102 of the bit stream. If a sequence of bits is found in the current portion 102 that matches a sequence of bits in the preceding portion 101, the sequence of bits in the current portion 102 is replaced with a reference to the same sequence of bits in the earlier portion 101. For example, the bit sequence in the current portion 102 would be replaced with a reference to bit sequence 103 in the earlier portion 101.

The reference that is inserted for bit sequence 102 identifies the length 104 of bit sequence 102 (which also is the same as the length of bit sequence 103) and the location of bit sequence 103. Here, the location of bit sequence 103 is expressed as a "distance" 105 from the current portion 102 to the matching bit sequence 103. As such, the LZ77 compression scheme encodes a bit sequence 102 as a "length, distance pair" that is inserted in the bit stream in place of sequence 102. Upon decoding the compressed stream, when the decoder reaches the length, distance pair that is embedded in the bit stream in place of bit sequence 102, it simply uses the distance part of the length, distance pair to refer back to the start of bit sequence 103 and reproduces the correct bit sequence for portion 102 of the decoded stream by reproducing a number of bits from the start of bit sequence 103 that is equal to the length component of the length, distance pair.

DEFLATE Compression Algorithm

The DEFLATE compression scheme, which is used to compress gzip, Zlib, PKZip and WinZip files, uses the LZ77 compression algorithm along with other compression schemes to effect a comprehensive overall compression scheme.

FIG. 2 shows an overview of the DEFLATE compression algorithm. As observed in FIG. 2, after LZ77 compression, the compressed bit stream can be viewed as a series of length/distance pairs 201_1, 201_2, . . . 201_M intermixed with literals 202_1, 202_2, . . . 202_N. Literals correspond to bit patterns within the original bit stream for which no earlier identical pattern could be identified within the applicable window for conversion into a length/distance pair.

The DEFLATE compression algorithm then proceeds to incorporate a next level of compression 203 upon the LZ77 compressed stream 200. The next level of compression 203 introduces two different types of Huffman encoding that together replace more common bit patterns of the length/distance pairs 201 and literals 202 with smaller codes 204 and less common bit patterns of the length/distance pairs 201 and literals 202 with larger codes 205. A first type of Huffman encoding is used to encode literals and lengths. A second type of Huffman encoding is used to encode distances. By representing more common bit patterns of the LZ77 compressed stream 200 with fewer bits, the overall size of the information as presented in the final DEFLATE compressed stream 206 should be reduced.

Parallel Load Register File for DEFLATE-Like Compression of Small Payloads

DEFLATE like compression schemes traditionally been applied to data storage, large document or other applications where the amount of data to be encoded/decoded (the payload) is fairly large. Recently, DEFLATE like encoding/decoding has renewed interest with respect to other applications that do not necessarily include large amounts of data to be encoded/decoded. Examples include various internal communications within a computing system (e.g., loading programmable embedded circuitry (e.g., embedded field programmable gate array (FPGA), programmable logic device (PLD), programmable logic array (PLA)) with the information used to configure the circuitry's logic functions), intra-die communication within multi-chip packages, sensor data compression, etc.).

A challenge is the overall efficiency of implementing a DEFLATE like decoding scheme in the case of a small payload. In particular, referring to FIG. 3, a fully encoded packet 301 includes header information 302 that essentially describes the unique codes for the payload 303. The processing of that overhead by the decoder to configure the decoder prior to actual decoding of the payload can consume a considerable amount of resources/time.

Here, recalling that the Huffman encoding process assigns smaller encoded symbols to more frequent data patterns and assigns larger encoded symbols to less frequent data patterns, the header information 302 within an encoded packet 301 will contain the decoding information describing which specific encoded symbols correspond to which specific decoded data patterns that are unique to the data patterns that were encoded to generate the compressed payload 303.

There is therefore an associated overhead when processing the packet 301 which includes customizing the decoder with the unique decoding information prior to actually decoding the payload 303. In the case of small payloads, the amount of time consumed configuring the decoder with the unique decoding information can become comparable to (in some cases even exceed) the time consumed decoding the payload 303. Thus, in the case of small payload environments, the decoder should be designed to streamline or otherwise economize the configuration setup of the unique decoding information for a particular payload to be decoded.

FIG. 4 shows a high level view of a Huffman decoder 400 that meets this particular challenge. With respect to the runtime operation of the decoder, i.e., after the decoder has been configured with the header information 402 for a particular payload 403, the payload 403 is processed by a payload parser 404. The payload parser 404 directs literal and length symbols found in the payload 403 to a literal/length decoding partition 405 and directs distance symbols found in the payload 403 to a distance decoding partition 406. Both partitions 405, 406 include an architecture in which payload symbols that are 10 bits or less are decoded by direct look-up into a register file 407, 408 and payload symbols that are more than 10 bits (e.g., 11 to 15 bits) are decoded by processing in an arithmetic logic unit (ALU) 409, 410.

Length and literal symbols that are 10 bits or less are decoded by applying the length and literal symbols found in the payload as part of an input address to the length/literal register file 407. Here, the register file 407 has been pre-configured with the unique decoding information found in the header 402 for the particular payload 403 being processed. The register file 407 therefore returns the correct decoding for each symbol less than 10 bits in response to that symbol being applied as part of an input read address to the register file 4078. By contrast, length/literal symbols that are more than 10 bits are decoded through execution of micro-operations performed by the ALU 409 rather than through a simple look-up as accomplished with the register file 407.

The register file vs. ALU architecture strikes an efficient balance between the performance of the overall decoder in view of the circuitry resources that are dedicated to its implementation. Specifically, the register file 407 provides for very fast decoding of a symbols. Specifically, in various embodiments, a decoded symbol can be provided in a single clock cycle after its counterpart encoded symbol is presented to the register file as part of an address. By contrast, the micro-op execution of the ALU 409 can consume multiple cycles to decode a single symbol.

The aforementioned concern regarding the setup and configuration of the decoder drives the split between register file look-up based decoding and ALU micro-sequenced based decoding. In particular, it would not be feasible to put all decoding information into the register file 407 because too much time would be consumed loading the register file 407 during its configuration. As such, by design, only a subset of all decodings are handled by the register file 407 (those having encoded symbols of 10 bits or less) with the remainder being handled by the ALU 410 (those have encoded symbols of 10 bits or more).

However, again recalling that Huffman encoding uses less bits to encode more frequently encountered data patterns, the register file 407 by design will handle the smaller encoded symbols (10 bits or less) so that the register file 407 is utilized much more frequently than the ALU 409 (which handles the larger and therefore less frequent encoded symbols). Thus the split register file/ALU decoding architecture economizes configuration setup time (by limiting the size of the register file 407) without significantly compromising decoding performance (the register file 407 will be used more frequently than the ALU 409). The distance decoding partition 406 is designed similarly to the length/literal decoding partition.

In a further embodiment, the register file 407 is designed to accelerate its configuration time by being able to simultaneously load register entries having identical decoding information. Here, some operational/design aspects of the register file 407 implementation are worthy to mention. Specifically, as a consequence of the register file 407 being designed to provide decoded values for encoded input symbols having a range of bit size length (e.g., 3 bits to 10 bits), the register file 407 is loaded with duplicate information to accommodate varying input symbol size.

Specifically, in an embodiment, the payload parser 404 recognizes a next symbol to be decoded in the payload 403 and will embed that symbol in the next 10 bits of payload 403 to be decoded (the "leading edge" of the payload) and forwards the 10 bits of leading edge payload to the register file 407. Thus, in an embodiment, the register file 407 continuously responds to a 10 bit input address regardless if the symbol to be decoded within the 10 bit input address is less than 10 bits.

For example, if the next symbol to be decoded in the payload is 3 bits, the parser 404 will provide the next 10 bits of the payload's leading edge to the register file 407 with the 3 bits to be decoded as the leading or front end of the 10 bits. Said another way, the parser 404 will provide a 10 bit data structure of the form SSSXXXXXXX to the register file 407 where S represents a bit of the next symbol to be decoded and X represents information in the payload that follows the 3 bit symbol SSS. Assuming the next symbol to be decoded immediately after the 3 bit symbol SSS is also less than 10 bits, the next 10 bit sequence that the parser 404 will provide to the register file 407 will be of the form XXXXXXXYYY where XXXXXXX is the same bit sequence from the payload and YYY is the three bit sequence in the payload 403 that follows the XXXXXXX sequence in the payload 403.

Here, the content of XXXXXXX could be any combination of 1s and 0s. That is, there are $2^7=128$ different possible values for XXXXXXX. Therefore, in order to ensure correct decoding behavior by the register file 407, there are 128 different decoding entries in the register file 407 for the 3 bit encoded symbol SSS (one entry for each unique bit pattern of the XXXXXXX bit sequence). Each entry will contain the same decode value to reflect the fact there is only one decoded value for the 3 bit symbol SSS.

The loading into the register file 407 of multiple copies of same information during configuration of the decoder complicates the challenge of keeping the configuration time of the register file 407 reasonable. Here, if the register file 407 is implemented as a traditional register file 407 that consumes one cycle per entry load, 128 cycles will be consumed just to load all the decoding information for the 3 bit symbol SSS.

Therefore in an embodiment the register file 407 is designed to support parallel loads of same information. That is, in an embodiment, the register file 407 is able to simultaneously load all entries having same information. With a parallel load approach, for example, all 128 entries for the 3 bit symbol SSS can be loaded into the register file 407 in a single cycle. By simultaneously loading same information into multiple register file entries the configuration time of the decoder can be dramatically reduced as compared to a decoder whose register file cannot simultaneously load same entries.

FIGS. 5a and 5b show a design for the register file 507 (FIG. 5a) and its address decoder 520 (FIGS. 5a, 5b) for supporting simultaneous loads of same information as described above. Here, as part of the configuration of the register file 507, a second data structure 521 is provided to the address decoder 520 that describes how many bits of the 10 bit address that will be provided to the register file 507 during nominal decoding for the decoded value being loaded are significant and/or insignificant. That is, for example, when the decoded value for the 3 bit symbol SSS is being loaded into the register file 507 during configuration, the register file 507 is informed via input information 521 that the decoded value is being loaded for a 3 bit encoded symbol, and/or, that there are 7 bits of trailing "don't care" information in the address that will be presented for the decode value during nominal decoding.

With the address decoder 520 being provided information 521 that indicates how many bits of a particular decoded value's address are insignificant, the address decoder 520 can determine each of the 128 entries that the decoded value could possibly map to and simultaneously activates each of these entries so that the value can be simultaneously loaded into all 128 entries.

Here, as is known in the art, the address decoder of a traditional register file can be viewed as having $2^N$ outputs where N is the number of address bits and where each decoder output is coupled to a different register/entry and represents a logical AND of a different/unique combination of address bit values. For example, in the simplistic case of a four entry register file having two address bits A0, A1 (N=2) there are four address decoder outputs that correspond to the following four logical AND functions:
1) (/A0)(/A1)
2) (A0)(/A1)
3) (/A0)(A1)
4) (A0)(A1)

In the case of the parallel load register file of FIGS. 5a and 5b, however, the decoder 520 outputs are articulated by a combination of OR and AND functions when the register file is in a configuration/load mode (the embedded OR function is not enabled during a nominal read of the register file during decoding runtime). In particular, when the register file is being loaded, the term for each don't care bit within the address of the value being loaded is given a logical true in the logical expression of the decoder output regardless if the term in the output expression is inverted or not inverted.

For example, using the four entry decoder discussed above as an example, if the A1 term in the address is a don't care, then the output expressions are reconfigured with both A1 and /A1 being regarded as a logical true in the output expressions. That is, the address decoder outputs are now expressed as:
1) (/A0)
2) (A0)
3) (/A0)
4) (A0)

In the above expression note that two outputs are always activated (the output equations are now only a function of A0) rather than just one output being activated as in the case of the traditional decoder. Said another way, the output expressions are reduced such that each term in an output expression represented by a non-substantive address bit is deemed a logical true irrespective of whether the term is expressed in the output equation as a logical true of the non substantive bit or a logical not true of the non substantive bit (where a non substantive address bit is a don't care bit). In this manner, multiple decoder outputs are simultaneously activated which permits multiple, parallel loading of their corresponding entries.

In the address decoder embodiment of FIG. 5b in which the register file has a 10 bit address, the four upper bits define one of sixteen banks and the six lower address bits define one of 64 entries in the targeted bank. The address decoder 520 includes multiple pre-decoder stages 523 that each decode neighboring pairs of address bits. Here, nominal address bits have notation $a_X$ whereas bits having notation $a'_X$ are used to indicate which of the address bits are don't care bits.

Thus, when a particular decoded value is being loaded into the register file, the correct substantive address information for the value is provided on the nominal address bit lines (e.g., bits $a_9$, $a_8$, $a_7$ for the 3 bit encoded symbol SSS) and the remaining bits of the don't care address construct are set to a logic high (e.g., bits $a'_6$ through $a'_0$ are set to a logic high). In response to this information, the output expressions of the pre-coders are such that any term in an output expression that corresponds to a don't care bit is treated as a logical true (irrespective of whether the term in the expression is a logical true or a logical not true during nominal/read mode). By so doing, multiple pre-decoder outputs will be activated that will cause the full decoder to activate any output having an expression that corresponds to the substantive address of the value being loaded being true.

Multi-Ported CAM with Binary Cells for Efficient DEFLATE-Like Compression

FIG. 6 shows another decoder embodiment 600 that is less sensitive to configuration setup but includes a number of efficiency improvements that permit the decoder to be instantiated in small semiconductor chip surface areas and/or low power consumption environments.

According to the decoder approach of FIG. 6, the length/literal Huffman decoding is performed with a first content addressable memory (CAM) circuit 607 and the distance Huffman decoding is performed with a second CAM circuit 608. Each CAM 607, 608 has an associated register file 609, 610 having respective entries that are each coupled to a different one of its CAM's output match lines.

During configuration, each CAM entry is loaded with a different encoded symbol and the register file entry that is coupled to the CAM entry's match line is loaded with the encoded symbol's decoded value. Payload information to be decoded is presented to one of the CAMs 607, 608 as a search key (with the lengths/literals to be decoded being provided to the length/literal CAM 607 and distances to be decoded being provided to the distance CAM 608). Upon the search key being presented to a CAM, the search key's content will match on one of the CAM entries which activates the entry's match line and causes the decoded content of the register file entry that is coupled to the match line to be provided at the register file output.

During operation, a next 15 bits of payload to be decoded is presented to a CAM as a search key with, e.g., the "left" end of the search key corresponding to information that is immediately next to be decoded and therefore containing the next symbol that is to be immediately decoded (information to the right of the symbol in the search key, if any, will be incorporated as the immediate left end of a next search key to be presented to a CAM).

The configuration setup for the decoder of FIG. 6 should not be appreciably large because the register files 609, 610 do not contain multiple copies of a same decoding. Rather, the register file 609 for the length/literal CAM 607 merely contains the 286 literal/length decoded values and the register file 610 for the distance CAM 608 merely contains the 30 distance decoded values.

A first improvement in the CAM implementation can be realized as a semiconductor chip surface area consumption improvement in that smaller CAM cells can be instantiated in certain CAM locations. More specifically, as is known in the art, CAMs are typically provided as binary CAMs or ternary CAMs. Binary CAMs perform a binary comparison at each search key bit position and will indicate a match at a particular CAM entry only if all bits in the CAM entry match all bits in the search key. By contrast, ternary CAMs provide enhanced capability whereby certain bits in the search key are allowed to be specified as don't care bits. As such, a ternary CAM will indicate a match for any entry whose bit values match those bit values of the search key that are not don't care bits. Ternany CAM cells have more functionality than binary CAM cells and therefore require more semiconductor surface area to implement than binary CAM cells.

A pertinent feature of Huffman decoding, as described above, is that there are a fixed number of unique codes for a specific amount of encoded data. In various implementations, for an encoded data size of $\log_2$ n bits only (n–1) encoded symbols are possible. That is, there can only be one encoded symbol having a bit length of 1, there can only be three unique encoded symbols having a bit length of 1 or 2 bits, there can only be seven encoded symbols having a bit length of 1, 2 or 3 bits, etc.

Thus, in an embodiment, shown in FIG. 7, the CAM is loaded in order of increasing encoded symbols size with "leftmost" CAM cell bit locations that are storing a coded symbol being implemented as binary CAM cells and the remaining CAM cell bit locations being implemented as ternary CAM cells. The use of binary cells instead of ternary cells reduces the size of the overall CAM.

Another efficiency improvement is to implement the CAM as a dual look-up CAM that can simultaneously perform two look-ups on a same table of entries in the CAM. Here, a first lookup corresponds to the main decoding thread being executed by the decoder while the second lookup corresponds to a speculative decoding thread. In the case of speculative decoding, sections of the payload yet to be formally decoded (i.e., are farther behind the leading edge of encoded payload) can be decoded with a high degree of success. In an embodiment, encoded length/distance pairs are made in reference to the prior 32 kB of decoded data relative to the leading edge of the payload. So long as the speculatively decoded payload data references data content that resides within the prior 32 kB of data relative to the current leading edge of the payload, speculative decoding can be successful.

Apart from speculative decoding, in an embodiment, the CAM is designed to support dual look-ups with a reduced physical footprint by sharing search key lines as between the two look-up paths. Here, as observed in FIG. 8, the CAM is essentially designed to perform simultaneous searches on 9 bit search key sizes. Thus, if the payload parser extracts a next 15 bits from the leading edge of the payload as the real decode search key and also presents another group of 15 bits from the payload that are further down from the leading edge as the speculative key and presents both keys to the CAM, the CAM only uses the leftmost nine bits of both keys and runs both through the CAM's dual search path (match ports 1 and 2 in FIG. 8). Here, again, the design takes advantage of the fact that the most frequently encountered encoded symbols will be nine bits or less.

Thus, in many cases, both search keys will hit on respective CAM entries. The match lines from the pair of entries activate two corresponding register file entries and the content of the two register file entries are presented as dual decoded outputs (a real decoded value and a speculative decode value). In an embodiment, the register file entries contain a bit of meta data that indicates whether or not its decoded value is derived from a symbol that is greater than nine bits. If either decoded value that is presented from the register file has the meta data bit set (indicating the decoded value is supposed to have been generated only from a symbol that is greater than nine bits), the decoded value is dropped (it is invalid because it was generated from a nine bit search key).

If the dropped decoded value is the real decoded value or if both the real and speculative decoded values are invalid, the full search key of 15 bits from the leading edge of the payload is run through the CAM using both the nine bit real search path and the extra middle 6 bit search path. If the dropped decoded value is the speculative decoded value and the real decoded value is valid, the full search key of 15 bits from the speculative section of the payload that resides a distance from leading edge of the payload is run through the CAM using the both the nine bit speculative search path and the extra middle/auxiliary 6 bit search path.

In some cases, for both real and speculative decodings, there may be a miss in the CAM in response to the initial nine bit search key. In response to a miss, a 15 bit search key is reapplied to the CAM using the middle/auxiliary 6 bit search path as described above.

Computing System Implementations

FIG. 9 shows a depiction of an exemplary computing system 900 such as a personal computing system (e.g., desktop or laptop) or a mobile or handheld computing system such as a tablet device or smartphone, or, a larger computing system such as a server computing system. In the case of a large computing system, various one or all of the components observed in FIG. 9 may be replicated multiple times to form the various platforms of the computer which are interconnected by a network of some kind.

As observed in FIG. 9, the basic computing system may include a central processing unit 901 (which may include, e.g., a plurality of general purpose processing cores and a main memory controller disposed on an applications processor or multi-core processor), system memory 902, a display 903 (e.g., touchscreen, flat-panel), a local wired point-to-point link (e.g., USB) interface 904, various network I/O functions 905 (such as an Ethernet interface and/or cellular modem subsystem), a wireless local area network (e.g., WiFi) interface 906, a wireless point-to-point link (e.g., Bluetooth) interface 907 and a Global Positioning System interface 908, various sensors 909_1 through 909_N (e.g., one or more of a gyroscope, an accelerometer, a magnetometer, a temperature sensor, a pressure sensor, a humidity sensor, etc.), a camera 910, a battery 911, a power management control unit 912, a speaker and microphone 913 and an audio coder/decoder 914.

An applications processor or multi-core processor 950 may include one or more general purpose processing cores 915 within its CPU 901, one or more graphical processing units 916, a main memory control function 917 and an I/O control function 918. The general purpose processing cores 915 typically execute the operating system and application software of the computing system. The graphics processing units 916 typically execute graphics intensive functions to, e.g., generate graphics information that is presented on the display 903. The memory control function 917 interfaces with the main/system memory 902. The main/system memory may be a multi-level system memory. The main memory control function 917 and one or more of the general purpose processing cores 915 may support execution of a prefetch instruction and corresponding flows associated with a load instruction that its load is dependent upon as described above.

Each of the touchscreen display 903, the communication interfaces 904-907, the GPS interface 908, the sensors 909, the camera 910, and the speaker/microphone codec 913, 914 all can be viewed as various forms of I/O (input and/or output) relative to the overall computing system including, where appropriate, an integrated peripheral device as well (e.g., the camera 910). Depending on implementation, various ones of these I/O components may be integrated on the applications processor/multi-core processor 950 or may be located off the die or outside the package of the applications processor/multi-core processor 950.

The system also includes non volatile storage 920 which, e.g., can further broken into firmware BIOS storage and traditional mass storage. Here, the aforementioned SSD device can be used for either of these non volatile storage 920 applications. Further still, the overall system of FIG. 6 as described above can also be conceivably used as a component of main memory 902.

Embodiments of the invention may include various processes as set forth above. The processes may be embodied in machine-executable instructions. The instructions can be used to cause a general-purpose or special-purpose processor (e.g., a controller) to perform certain processes. Alternatively, these processes may be performed by specific hardware components that contain hardwired logic for performing the processes, or by any combination of software or instruction programmed computer components or custom hardware components, such as application specific integrated circuits (ASIC), programmable logic devices (PLD), digital signal processors (DSP), or field programmable gate array (FPGA).

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
  a Huffman decoder circuit comprising:
    a register file with simultaneous parallel load capability, the register file to keep multiple copies of same decoded values in different entries of the register file, the different entries being addressed by respective addresses having a same leading edge encoded symbol, the parallel load capability to simultaneously load a same decoded value for those register file addresses having a same leading edge encoded symbol.

2. The apparatus of claim 1 wherein the register file is to keep length and literal decoded values.

3. The apparatus of claim 1 wherein the register file is to keep distance decoded values.

4. The apparatus of claim 1 wherein the respective addresses are 10 bits.

5. The apparatus of claim 4 wherein the Huffman decoder comprises an ALU circuit to process encoded symbols that are more than 10 bits.

6. The apparatus of claim 1 wherein the register file is part of one of a literal/length decoding partition or a distance decoding partition, the Huffman decoder comprising a payload parser circuit to direct length and literal encoded symbols found within a payload to the literal/length decoding partition, and to direct distance encoded symbols found within the payload to the distance decoding partition.

7. The apparatus of claim 1 wherein the register file includes an input to specify don't care bits when a decoded value is being loaded into the register file, the don't care bits causing an address decoder of the register file to determine decoded outputs as logical expressions in which terms of a don't care value are deemed a logical true irrespective of whether the terms express a logical true of the don't care value or a logical not true of the don't care value.

8. An apparatus, comprising:
  a Huffman decoder circuit comprising:
    a CAM circuit coupled to a register file, wherein respective match lines of the CAM circuit are coupled to respective entries of the register file, the CAM circuit to keep encoded symbols, the register file to keep decoded values of the encoded symbols, the CAM circuit comprising at least one of the following:
    a) binary cells and ternary cells, the binary cells mapped to input search key terms of a predefined leading edge encoded symbol, the ternary cells mapped to input search key terms composed of encoded information following the leading edge encoded symbol;
    b) multiple search paths, wherein, respective search widths along both search paths is less than a real search key provided to a first of the search paths and a speculative search key provided to a second of the search paths, the search paths having a shared additional search width in case a respective search key is greater than the respective search widths.

9. The apparatus of claim 8 wherein the register file is to keep information indicating whether a decoded value must originate from a search key that is greater than the respective search widths.

10. The apparatus of claim 8 wherein the real and speculative search keys are 15 bits.

11. The apparatus of claim 8 wherein the register file is part of one of a literal/length decoding partition or a distance decoding partition, the Huffman decoder comprising a payload parser circuit to direct length and literal encoded symbols found within a payload to the literal/length decoding partition, and to direct distance encoded symbols found within the payload to the distance decoding partition.

12. A computing system, comprising:
a plurality of processing cores;
a memory controller;
a system memory coupled to the memory controller;
a Huffman decoder circuit comprising i) or ii) below:
i) a register file with simultaneous parallel load capability, the register file to keep multiple copies of same decoded values in different entries of the register file, the different entries being addressed by respective addresses having a same leading edge encoded symbol, the parallel load capability to simultaneously load a same decoded value for those register file addresses having a same leading edge encoded symbol;
ii) a CAM circuit coupled to a register file, wherein respective match lines of the CAM circuit are coupled to respective entries of the register file, the CAM circuit to keep encoded symbols, the register file to keep decoded values of the encoded symbols, the CAM circuit comprising at least one of the following:
a) binary cells and ternary cells, the binary cells mapped to input search key terms of a predefined leading edge encoded symbol, the ternary cells mapped to input search key terms composed of encoded information following the leading edge encoded symbol;
b) multiple search paths, wherein, respective search widths along both search paths is less than a real search key provided to a first of the search paths and a speculative search key provided to a second of the search paths, the search paths having a shared additional search width in case a respective search key is greater than the respective search widths.

13. The computing system of claim 12 wherein the Huffman decoder is to decoder programmable circuit information within the computing system.

14. The apparatus of claim 12 wherein the register file is to keep length and literal decoded values.

15. The apparatus of claim 12 wherein the register file is to keep distance decoded values.

16. The apparatus of claim 12 wherein i) above applies and the respective addresses are 10 bits.

17. The apparatus of claim 16 wherein the Huffman decoder comprises an ALU circuit to process encoded symbols that are more than 10 bits.

18. The apparatus of claim 12 wherein i) above applies and the register file includes an input to specify don't care bits when a decoded value is being loaded into the register file, the don't care bits causing an address decoder of the register file to determine decoded outputs as logical expressions in which terms of a don't care value are deemed a logical true irrespective of whether the terms express a logical true of the don't care value or a logical not true of the don't care value.

19. The apparatus of claim 12 wherein ii) above applies and the real and speculative search keys are 15 bits.

20. The apparatus of claim 19 wherein the register file is part of one of a literal/length decoding partition or a distance decoding partition, the Huffman decoder comprising a payload parser circuit to direct length and literal encoded symbols found within a payload to the literal/length decoding partition, and to direct distance encoded symbols found within the payload to the distance decoding partition.

* * * * *